(12) United States Patent
Lee et al.

(10) Patent No.: US 9,974,173 B2
(45) Date of Patent: May 15, 2018

(54) MULTILAYER CERAMIC SUBSTRATE AND MANUFACTURING THEREOF

(71) Applicant: SAMSUNG ELECTRO-MECHANICS CO., LTD., Suwon-Si, Gyeonggi-Do (KR)

(72) Inventors: Taek Jung Lee, Suwon-Si (KR); Yong Suk Kim, Suwon-Si (KR)

(73) Assignee: SEMCNS CO., LTD., Seongnam-si, Gyeonggi-do (KR)

( * ) Notice: Subject to any disclaimer, the term of this patent is extended or adjusted under 35 U.S.C. 154(b) by 0 days. days.

(21) Appl. No.: 14/887,108

(22) Filed: Oct. 19, 2015

(65) Prior Publication Data

US 2016/0157341 A1   Jun. 2, 2016

(30) Foreign Application Priority Data

Dec. 1, 2014 (KR) .................. 10-2014-0169573

(51) Int. Cl.
| | |
|---|---|
| *H05K 1/09* | (2006.01) |
| *H05K 3/40* | (2006.01) |
| *H05K 3/46* | (2006.01) |
| *H01L 23/498* | (2006.01) |
| *H01L 21/48* | (2006.01) |

(52) U.S. Cl.
CPC ........... *H05K 1/092* (2013.01); *H05K 3/4007* (2013.01); *H05K 3/4629* (2013.01); *H01L 21/486* (2013.01); *H01L 21/4857* (2013.01); *H01L 23/49822* (2013.01); *H01L 23/49827* (2013.01); *H01L 2924/0002* (2013.01); *H05K 2201/0338* (2013.01)

(58) Field of Classification Search
CPC ... H05K 1/02; H05K 1/11; H05K 1/09; H01L 21/48
USPC .................. 174/257, 256, 258; 361/750, 751
See application file for complete search history.

(56) References Cited

U.S. PATENT DOCUMENTS

| | | | | |
|---|---|---|---|---|
| 5,029,242 A | * | 7/1991 | Sammet | C03C 14/004 156/89.28 |
| 5,156,903 A | * | 10/1992 | Okumura | B32B 18/00 428/209 |
| 5,627,344 A | * | 5/1997 | Tanifuji | H01L 23/49883 174/256 |
| 5,639,562 A | * | 6/1997 | Natarajan | C03C 17/36 257/E23.113 |
| 6,238,741 B1 | * | 5/2001 | Blazick | H01L 51/0004 101/123 |
| 8,168,288 B2 | * | 5/2012 | Nomiya | H05K 3/4611 156/89.16 |

(Continued)

FOREIGN PATENT DOCUMENTS

| | | |
|---|---|---|
| JP | 2004-260098 A | 9/2004 |
| KR | 10-2009-0112937 A | 10/2009 |

*Primary Examiner* — Timothy Thompson
*Assistant Examiner* — Michael F McAllister
(74) *Attorney, Agent, or Firm* — McDermott Will & Emery LLP

(57) ABSTRACT

A multilayer ceramic substrate includes stacked ceramic layers, and external electrodes including first conductive layers penetrating through one region of an outermost layer of the stacked ceramic layers to thereby be embedded therein, and second and third conductive layers sequentially stacked on the first conductive layers. Each of the first and second conductive layers is formed of a ceramic powder and a metal powder.

12 Claims, 2 Drawing Sheets

(56) References Cited

U.S. PATENT DOCUMENTS

| | | | |
|---|---|---|---|
| 8,222,529 B2* | 7/2012 | Sung ..................... | H05K 1/113 174/255 |
| 2004/0155227 A1* | 8/2004 | Bechtloff ................ | C03C 3/066 252/500 |
| 2006/0022173 A1* | 2/2006 | Yamakawa ............. | H01B 1/22 252/500 |
| 2009/0188555 A1* | 7/2009 | Castillo ................. | C09D 11/52 136/256 |

* cited by examiner

MULTILAYER CERAMIC SUBSTRATE AND MANUFACTURING THEREOF

CROSS-REFERENCE TO RELATED APPLICATION

This application claims the priority and benefit of Korean Patent Application No. 10-2014-0169573 filed on Dec. 1, 2014, with the Korean Intellectual Property Office, the disclosure of which is incorporated herein by reference.

BACKGROUND

The present disclosure relates to a multilayer ceramic substrate and manufacturing thereof.

To meet growing demand for miniaturization of electronics, it is required that ceramic packages have stable characteristics in high frequency bands, allowing for the manufacturing of light, thin, and small electronic components such as an RF chip, an IC chip, a sensor chip, an X-Tal LED, or the like, from which heat may be easily dissipated, able to be easily surface-mounted, and allowing for increased product reliability.

To form a ceramic package as described above, a package having appropriately formed internal patterns, a sufficient electrode material filling rate in forming via electrodes, decreased warpage deformation, and a constant pattern interval has been required.

Particularly, adhesive force between a ceramic substrate and an external electrode pattern is significantly important for the securing of reliability of the ceramic package.

To this end, at the time of sintering heterogeneous materials such as a ceramic substrate, electrodes for forming an external pattern, and electrodes for forming vias, or the like, matching of shrinkage behavior and interfacial coupling force should be secured. In addition, the structure of electrodes and a compositional design of the ceramic substrate are also important.

SUMMARY

An aspect of the present disclosure may provide a multilayer ceramic substrate having increased adhesive force between a ceramic layer and external electrodes.

An aspect of the present disclosure may provide a multilayer ceramic substrate to prevent decrease of adhesive force between ceramic layers and external electrodes from being deteriorated due to mismatching of heterogeneous materials at the time of manufacturing a multilayer ceramic substrate by co-firing the ceramic layers and the external electrodes.

According to an aspect of the present disclosure, a multilayer ceramic substrate may include: a ceramic layer including a plurality of ceramic sheets which are stacked; and external electrodes each including a first conductive layer penetrating through one region of an outermost ceramic sheet of the ceramic layer to thereby be embedded therein, and second and third conductive layers sequentially stacked on the first conductive layer. The first and second conductive layers may be formed of a ceramic powder and a metal powder, whereby deterioration of adhesive strength between the ceramic layer and the external electrode may be prevented.

An interfacial area between the via electrode and the external electrode may be increased by forming the first conductive layer connected to the via electrode to have a width greater than that of the via electrode, and a compositional ratio between the ceramic powder and the metal powder in the first and second conductive layers may be controlled, such that deterioration of adhesive strength between the ceramic layer and the external electrode may be prevented.

Therefore, in the multilayer ceramic substrate according to an exemplary embodiment of the present disclosure, the interfacial area between the via electrode and the external electrode may be increased, and the first and second conductive layers of the external electrode are formed of the ceramic powder and the metal powder, such that adhesive strength between the ceramic layer and the external electrode after sintering may be improved, and a difference in firing shrinkage rates between the ceramic layer and the external electrode at the time of firing may be controlled, whereby reliability of the external electrode at the time of surface-mounting may be improved.

According to another aspect of the present disclosure, a method for manufacturing a multilayer ceramic substrate may include: filling a through hole of a first ceramic sheet with a first conductive layer, and sequentially stacking second and third conductive layers on a surface of the first ceramic sheet to cover the first conductive layer; forming a via electrode in a through hole of a second ceramic sheet; forming an internal electrode on a surface of a third ceramic sheet; and sequentially stacking the first through the third ceramic sheets on one another, and simultaneously firing the stacked first through third ceramic sheets, the via electrode, the internal electrode, and the first through third conductive layers. The internal electrode may be electrically connected to the third conductive layer through the via electrode formed in the second ceramic sheet and the first conductive layer formed in the first ceramic sheet. The first and second conductive layers may be formed of a ceramic powder and a metal powder.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
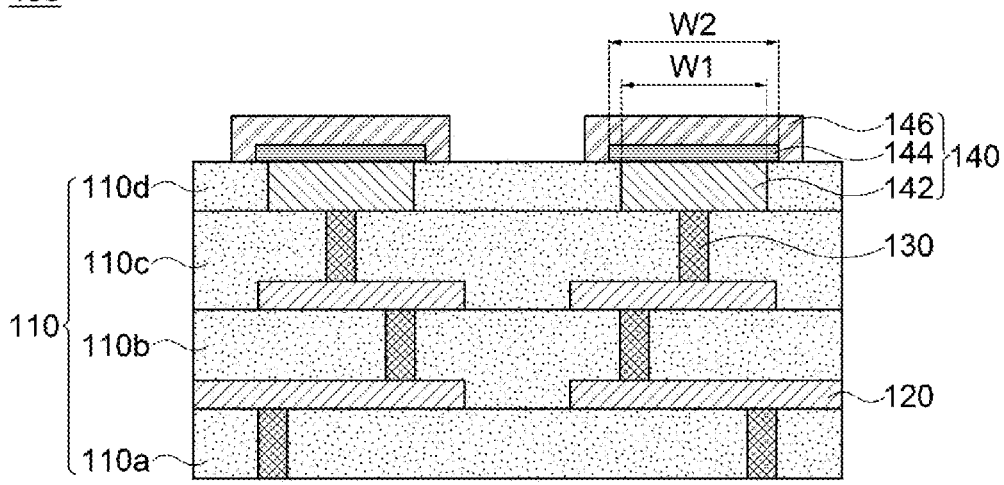
FIG. 1 is a cross-sectional view of a multilayer ceramic substrate according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Hereinafter, a multilayer ceramic substrate and a method of manufacturing the same according to exemplary embodiments of the present disclosure will be described in detail with reference to FIGS. 1 through 4.

FIG. 1 is a cross-sectional view of a multilayer ceramic substrate according to an exemplary embodiment in the present disclosure.

As illustrated in FIG. 1, a multilayer ceramic substrate 100 according to the present exemplary embodiment may include a ceramic layer 110 having a multilayer structure, and external electrodes 140 partially embedded in the ceramic layer 110 to a predetermined depth. In this case, a plurality of internal electrodes 120 and a plurality of via electrodes 130 may be formed within the ceramic layers 110.

The ceramic layer 110, in which a plurality of plate-shaped sheets 110a, 110b, 110c, and 110d are stacked, may be formed by stacking a plurality of ceramic green sheets and compressing and firing the stacked ceramic green sheets.

The ceramic layer 110 configured as described above may be formed by co-firing the plurality of ceramic green sheets, the external electrodes including conductive layers formed in an outermost ceramic green sheet and exposed to the outside of the outermost ceramic green sheet, the internal electrodes and the via electrodes formed in the plurality of ceramic green sheets so as to be coupled to each other.

Although the ceramic layer 110 in FIG. 1 is illustrated as having four ceramic sheets 110a, 110b, 110c, and 110d stacked therein for convenience of explanation, the number of ceramic sheets constituting the ceramic layer 110 may be increased or decreased if necessary.

The ceramic layer 110 may include ceramic powder containing a general oxide or nitride, or the like, used as a low temperature co-fired ceramic (LTCC) material or high temperature co-fired ceramic (HTCC) material.

As an example of the ceramic powder constituting a LTCC ceramic layer 110, a composite of alumina ($Al_2O_3$) powder and glass powder may be used. As an example of the ceramic powder constituting a HTCC ceramic layer 110, alumina ($Al_2O_3$) powder may be used.

The internal electrodes 120, used as internal circuit layers, internal pads, or the like, may be formed on the plurality of ceramic green sheets and then co-fired, together with the ceramic green sheets, to thereby be included in the ceramic layer 110.

The via electrodes 130 may penetrate through each of the ceramic sheets of the ceramic layer 110 to electrically connect the internal electrodes 120 and the external electrodes 140 to each other. The via electrodes 130 may be formed to fill via holes penetrating through each of the ceramic green sheets with an electrode material, and then may be co-fired together with the ceramic green sheets to thereby be included in the ceramic layer 110.

The internal electrodes 120 and the via electrodes 130 as described above may be formed of metal powder capable of being co-fired together with the ceramic layer 110. For example, silver (Ag), copper (Cu), tungsten (W), molybdenum (Mo), or the like, may be used.

Meanwhile, although internal electrodes 120 formed on two ceramic sheets 110a and 110b and via electrodes 130 formed in three ceramic sheets 110a, 110b, and 110c to connect these internal electrodes 120 are illustrated in FIG. 1, the numbers, positions, shapes, and the like, of internal electrodes 120 and via electrodes 130 configuring the multilayer ceramic substrate may be variously changed depending on a design of the substrate.

The external electrodes 140 may be used as connection terminals, or the like, for forming electrical connections with an electronic component to be mounted on the multilayer ceramic substrate 100 or electrical connection with an external terminal.

External electrodes of a general multilayer ceramic substrate are formed of metal powder, and in general, ceramics and metals have different coefficients of thermal expansion (CTE). Therefore, it is known that in the case of co-firing a ceramic layer and a metal layer, adhesive strength between the ceramic layer and the metal layer may be decreased due to the mismatching caused by differences in shrinkage rates between heterogeneous materials at the time of firing and stress inherent in an interface between the ceramic layer and the metal layer.

However, since co-firing technology has advantages such as a simplified process of co-firing ceramics and metals, and high integration, lightness, thinness, and miniaturization of components in spite of the above-mentioned disadvantages, it is difficult to exclude co-firing technology at the time of manufacturing a multilayer ceramic substrate.

Therefore, according to the present inventive concept, in order to prevent adhesive strength between heterogeneous materials from being deteriorated due to mismatches depending on the co-firing of the heterogeneous materials, the configuration of the external electrodes 140 is changed, and a detailed example of an application thereof will be described below.

In order to solve the above-mentioned problem, the external electrode 140 according to an exemplary embodiment may include a first conductive layer 142, a second conductive layer 144, and a third conductive layer 146 which are sequentially stacked.

First, among the conductive layers constituting the external electrode 140, the first conductive layer 142, a layer contacting the via electrode 130, may penetrate through a portion of the outermost sheet 110d of the ceramic layer 110 to thereby be embedded.

The first conductive layer 142 may be formed of a mixture of ceramic powder and metal powder in order to minimize a difference in CTE between the first conductive layer 142 and the ceramic layer 110 at the time of firing.

In view of improving adhesive strength between the ceramic layer 110 and the second conductive layer 144 of the external electrode 140 and controlling firing shrinkage rates thereof, the first conductive layer 142 may contain at least 20 wt % of ceramic powder, and more preferably, a compositional ratio of the ceramic powder and the metal powder may be (20 wt % to 30 wt %):(70 wt % to 80 wt %).

Here, when the content of the ceramic powder in the first conductive layer 142 is lower than 20 wt %, it may be difficult to control shrinkage behaviors at the time of firing and secure sufficient adhesive strength, and when the content of the ceramic powder is higher than 30 wt %, conductivity of the external electrode 140 may be deteriorated.

Further, since the first conductive layer 142 is connected to the via electrode 130, in order to increase an interfacial area between the first conductive layer 142 and the via electrode 130, the first conductive layer 142 may be formed to have a first width W1 greater than that of the via electrode 130. When the interfacial area between the first conductive layer 142 and the via electrode 130 is increased, interfacial coupling strength therebetween may be increased.

Next, among the conductive layers constituting the external electrode 140, the second conductive layer 144 may protrude externally from an external surface of the outermost sheet 110d of the ceramic layer 110 to thereby be formed on the first conductive layer 142. That is, the second conductive layer 144 may be exposed to the outside of the ceramic layer 110.

The second conductive layer 144 may be formed of a mixture of ceramic powder and metal powder in order to improve adhesive strength with the first conductive layer 142 while minimizing differences in CTE between the first and second conductive layers 142 and 144, and the ceramic layer 110 and the second conductive layer 144 at the time of firing.

In view of improving adhesive strength between the ceramic layer 110 and the first and third conductive layers 142 and 146 constituting the external electrode 140 and controlling the firing shrinkage rates thereof, the content of the ceramic powder in the second conductive layer 144 may be between the contents of the ceramic powder of the first and second conductive layers 142 and 146.

The content of the ceramic powder in the second conductive layer 144 may be at least 5 wt % or more, and a compositional ratio of the ceramic powder and the metal powder may be (5 wt % to 10 wt %):(90 wt % to 95 wt %).

When the content of the ceramic powder is lower than 5 wt %, the effect of the second conductive layer 144 may be insufficient, and when the content thereof is higher than 10 wt %, adhesive strength between the second and third conductive layers 144 and 146 may be deteriorated, such that conductivity of the external electrode 140 may be deteriorated.

As the ceramic powder of the first and second conductive layers 142 and 144, a material known in the art may be used without limitation, and the ceramic powder may be formed of a general oxide or nitride, or the like, used as the LTCC or HTCC material.

Preferably, in view of controlling a difference in the firing shrinkage rates between the external electrode and the ceramic layer 110, the ceramic powder of the first and second conductive layers 142 and 144 may be the same as that of the ceramic layer 110, and powder of at least one of magnesium carbonate ($MgCO_3$), barium carbonate ($BaCO_3$), calcium carbonate ($CaCO_3$), silica ($SiO_2$), and the like, may be additionally added thereto and mixed therewith.

Powder of magnesium carbonate ($MgCO_3$), barium carbonate ($BaCO_2$), calcium carbonate ($CaCO_3$), silica ($SiO_2$), and the like, may be used to control the difference in the firing shrinkage rates between the external electrode and the ceramic layer 110, and decrease or increase a firing temperature of the first and second conductive layers 142 and 144.

The metal powder of the first and second conductive layers 142 and 144 may be metal powder capable of being co-fired together with the ceramic layer 110. For example, silver (Ag), copper (Cu), tungsten (W), molybdenum (Mo), or the like, may be used.

The second conductive layer 144 may have a second width W2 equal to or greater than the first width W1 of the first conductive layer 142. That is, W1 and W2 may satisfy W1≤W2. A case in which the second conductive layer 144 has a width greater than that of the first conductive layer 142 is illustrated in FIG. 1.

When the second conductive layer 144 has a width greater than that of the first conductive layer 142, since a portion of the second conductive layer 144 not contacting the first conductive layer 142 is bonded to the ceramic layer 110, interfacial coupling strength between the ceramic layer 110 and the second conductive layer 144 may be improved, advantageous for suppressing a delamination defect in which the second conductive layer 144 and the ceramic layer 110 are separated from each other.

Then, among the conductive layers constituting the external electrode 140, the third conductive layer 146 may be formed on the second conductive layer 144. In this case, the third conductive layer 146 may be formed to cover an upper surface and side surfaces of the second conductive layer 144 in order to complement conductivity.

In addition, the third conductive layer 146 may be formed of metal powder in order to prevent conductivity of the external electrode 140 from being deteriorated. Here, the metal powder constituting the third conductive layer 146 may be metal powder capable of being co-fired together with the ceramic layer 110. For example, silver (Ag), copper (Cu), tungsten (W), molybdenum (Mo), or the like, may be used, and particularly, silver (Ag) may be representatively used.

Due to the configuration as described above, in the external electrode 140, the content of the ceramic powder may be increased downwardly from the third conductive layer 146 to the first conductive layer 142. That is, the conductive layer which is closer to the ceramic layer 110 has an increased content of the ceramic powder.

The external electrode 140 configured as described above may be composed of the ceramic powder and the metal powder, the difference in the firing shrinkage rates between the external electrode 140 and the ceramic layer 110 may be controlled and adhesive strength between the ceramic layer 110 and the external electrode 140 may be improved by the first and second conductive layers 142 and 144 of which the content of the ceramic powder is controlled to be increased downwardly.

Further, in the external electrode 140 configured as described above, adhesive strength with the first conductive layer 142 may be further improved by forming the second conductive layer 144 having a width greater than that of the first conductive layer 142.

As described above, since the multilayer ceramic substrate according to the present exemplary embodiment may suppress the external electrode 140 from being separated from the ceramic layer 140 due to excellent adhesive strength between the ceramic layer 110 and the external electrodes 140, at the time of surface-mounting, reliability of the external electrode 140 may be improved.

Further, since the difference in the firing shrinkage rates between the external electrode 140 and the ceramic layer 110 may be controlled, the generation of warpage may be suppressed, such that a substrate having uniform flatness may be manufactured.

In addition, the multilayer ceramic substrate 100 configured as described above may control the firing shrinkage rates and allow a pattern to be formed precisely, and accordingly, a large-area ceramic substrate and package may be manufactured, such that a degree of freedom in design for manufacturing a RF module, a sensor module, and a package may be secured.

Although the external electrode 140 of which the first conductive layer 142 is embedded in the outermost sheet 110*d* of the ceramic layer 110 is illustrated in FIG. 1, the external electrode 140 is not necessarily limited thereto. That is, the external electrode 140 may also be formed on both surfaces of the ceramic layer 110 using uppermost and lowermost layers of the ceramic layer 110.

In addition, although a case in which the number of each of the first and second conductive layers 142 and 144 is one is illustrated in FIG. 1 for convenience of explanation, the number of each of the first and second conductive layers 142 and 144 is not limited thereto. The number of each of the first and second conductive layers 142 and 144 may be two or more.

Further, in the present disclosure, adhesive strength between the ceramic layer 110 and the external electrode 140 may be improved by controlling the compositional ratios of the ceramic powder and the metal powder in the first and second conductive layers 142 and 144 constituting the external electrode 140, and by changing a structure, or the like, but in a case in which powders of the first to third conductive layers 142, 144, and 146 constituting the external electrode 140 and the ceramic layer 110 are formed to have the same average particle size of several μm or so or average particle sizes within a significant difference of 5 μm or less, adhesive strength between the ceramic layer 110 and the external electrode 140 may be further improved. In this case, the ceramic powder and the metal powder may have average particles sizes of about 0.5 to 2 μm, preferably about 0.8 to 1.2 μm.

A method of manufacturing a multilayer ceramic substrate according to an exemplary embodiment will be described below.

The method of manufacturing a multilayer ceramic substrate according to the present exemplary embodiment will be described with reference to the multilayer ceramic substrate illustrated in FIG. 1, and since materials of a ceramic layer, internal electrodes, via electrodes, external electrodes, and the like, may be the same as those in the previous exemplary embodiment, overlapping descriptions will be omitted.

Figure 2:
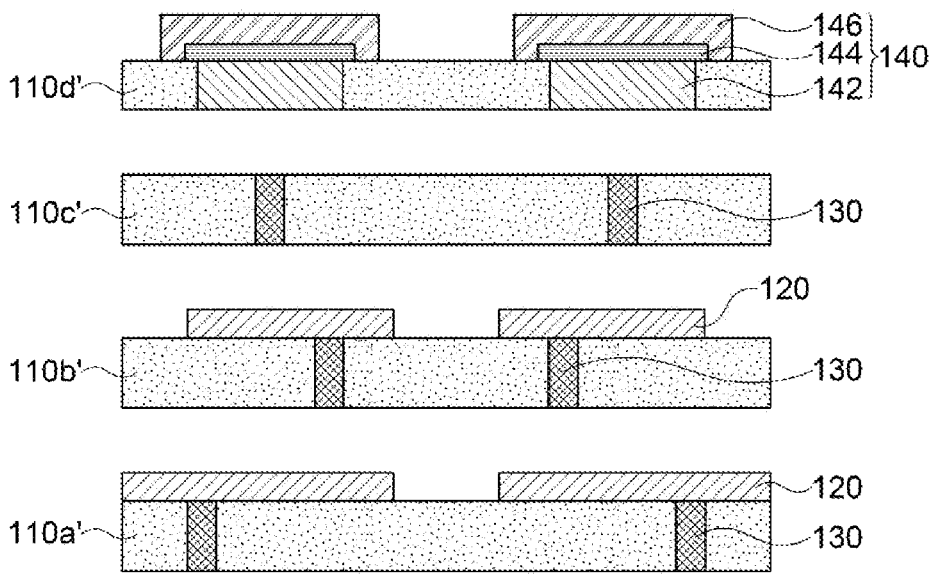
FIGS. 2 to 4 are cross-sectional views illustrating a method of manufacturing a multilayer ceramic substrate according to an exemplary embodiment in the present disclosure.
Figure 3:
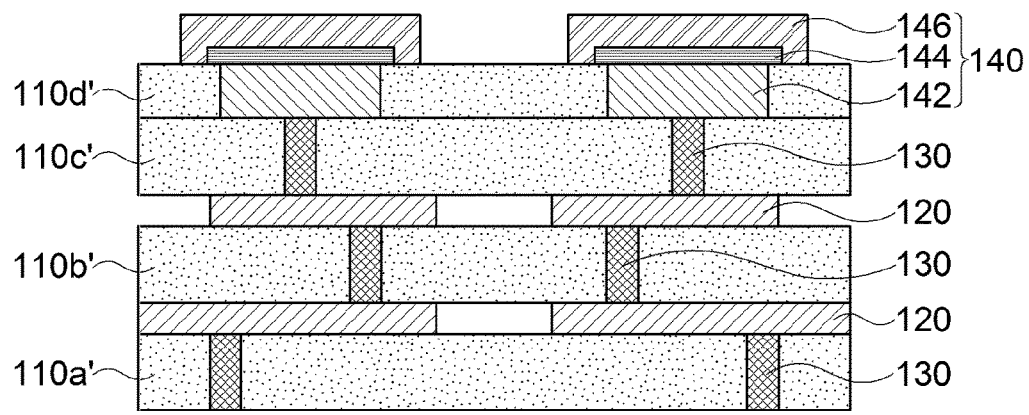
Figure 4:
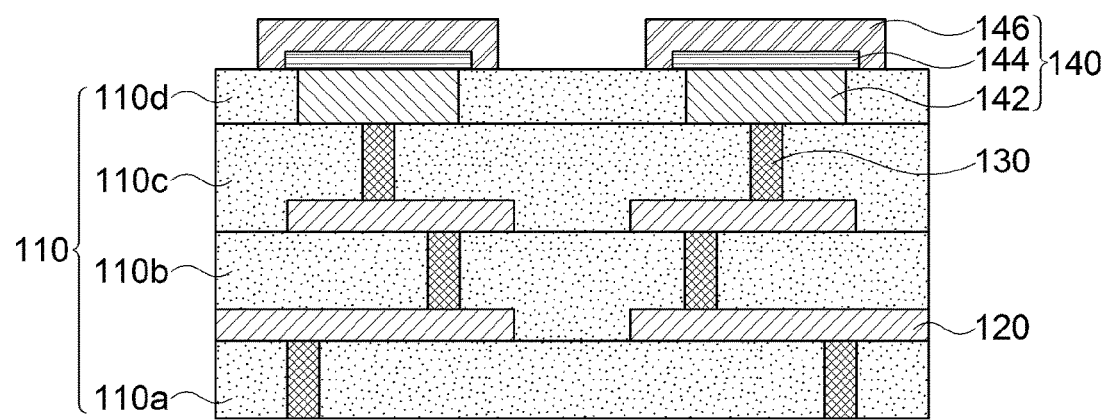

FIGS. 2 to 4 are cross-sectional views illustrating a method of manufacturing a multilayer ceramic substrate according to an exemplary embodiment in the present disclosure. FIG. 2 is a cross-sectional view illustrating an operation of forming at least one of internal electrodes, via electrodes, and external electrodes on a plurality of ceramic green sheets, FIG. 3 is a cross-sectional view illustrating an operation of stacking the plurality of ceramic green sheets on which at least one of the internal electrodes, the via electrodes, and the external electrodes is formed, and FIG. 4 is a cross-sectional view illustrating an operation of co-firing a ceramic green sheet multilayer body.

As illustrated in FIG. 2, in order to manufacture the multilayer ceramic substrate according to the present exemplary embodiment, first, a plurality of ceramic green sheets 110a', 110b', 110c', and 110d' for constituting a ceramic layer may be prepared.

In this case, the plurality of ceramic green sheets 110a', 110b', 110c', and 110d' may be formed to have a thickness of several mm by mixing ceramic powder, a binder, and a solvent to prepare slurry, applying the slurry to carrier films using a doctor blade method, or the like, and then drying the applied slurry.

Then, the via electrodes 130 may be formed by etching regions of the plurality of ceramic green sheets 110a', 110b', and 110c' in which each of the via electrodes 130 will be formed using laser drilling, mechanical drilling, or the like, to form via holes (not illustrated) and then, inserting a conductive paste containing metal powder, an organic binder, and a solvent into the via holes.

Next, the internal electrodes 120 contacting the via electrodes 130 may be formed by printing a conductive paste containing metal powder, an organic binder, and a solvent on one surfaces of the plurality of ceramic green sheets 110a' and 110b'.

First conductive layers 142 may be formed in the ceramic green sheet 110d' by etching a region of the ceramic green sheet 110d' in which each of the first conductive layers 142 will be formed to form a through hole (not illustrated) and then, inserting a conductive paste containing ceramic powder, metal powder, an organic binder, and a solvent into the through hole. Thereafter, second conductive layers 144 may be formed on the first conductive layers 142 embedded in the ceramic green sheet 110d' to have a width equal to or wider than that of the first conductive layer 142 by printing a conductive paste containing ceramic powder, metal powder, an organic binder, and a solvent thereon using a thick film printing method, or the like. Then, third conductive layers 146 may be formed on the second conductive layers 144 by printing a conductive paste containing metal powder, an organic binder, and a solvent thereon using a thick film printing method, or the like. Therefore, the external electrode 140 in which the first to third conductive layers 142, 144, and 146 are sequentially stacked may be completed.

Next, as illustrated in FIG. 3, a ceramic green sheet multilayer body may be formed by sequentially stacking the plurality of ceramic green sheets 110a', 110b', 110c', and 110d'.

In this case, the ceramic green sheets 110a' and 110b' in which the internal electrodes 120 and the via electrodes 130 are formed may be sequentially disposed below, the ceramic green sheets 110d' on which the external electrodes 140 are formed may be disposed thereon, and the ceramic green sheet 110c' in which the via electrodes 130 are formed may be interposed between the ceramic green sheet 110b' and the ceramic green sheet 110d'.

Next, as illustrated in FIG. 4, the ceramic green sheet multilayer body of FIG. 3 may be fired, thereby manufacturing the multilayer ceramic substrate 100.

In this case, the plurality of ceramic green sheets 110a', 110b', 110c', and 110d' (see FIG. 3), the internal electrodes 120, the via electrodes 130, and the external electrodes 140 may be simultaneously fired by a firing method, and this method is referred to as a co-firing method.

The ceramic green sheets 110a', 110b', 110c', and 110d' of FIG. 3 may be fired to thereby be bonded to each other using the co-firing method, such that the ceramic layer 110 corresponding to the multilayer body in which the ceramic sheets 110a, 110b, 110c, and 110d are sequentially stacked from the bottom may be formed, and the internal electrodes 120, the via electrodes 130, and the first conductive layers 142 of the external electrodes 140 may be embedded in the ceramic layer 110.

An interface between the ceramic layer 110 and the external electrode 140 may become dense by the co-firing method, such that adhesive strength therebetween may be improved.

The co-firing method may be performed at a low temperature of 800° C. to 900° C. or a high temperature of 1500° C. to 1600° C. depending on ingredients of the ceramic layer.

The multilayer ceramic substrate 100 according to the present exemplary embodiment, manufactured to have the above-mentioned configuration by the method as described above may be a high-strength substrate capable of having excellent adhesive strength between the ceramic layer 110 and the external electrode 140 and decreased warpage deformation even in the case that the ceramic layer 110 and the external electrode 140 are formed by co-firing.

The multilayer ceramic substrate 100 configured as described above may control the firing shrinkage rates and allow a pattern to be formed precisely, and accordingly, a large-area ceramic substrate and package may be manufactured, such that a degree of freedom in design for manufacturing a RF module, a sensor module, and a package may be secured.

As set forth above, according to exemplary embodiments in the present disclosure, even though the multilayer ceramic substrate is formed by the co-firing method, adhesive strength between the ceramic layer and the external electrode may be improved due to the external electrode of which the conductive layers adjacent to the ceramic layer are formed of the ceramic powder and the metal powder, and the interfacial area between the via electrode and the conductive layer is large, such that reliability of the external electrode may be excellent.

While exemplary embodiments have been shown and described above, it will be apparent to those skilled in the art that modifications and variations could be made without departing from the scope of the present invention as defined by the appended claims.

What is claimed is:

1. A multilayer ceramic substrate comprising:
   a ceramic layer including a plurality of ceramic sheets stacked on one another; and
   external electrodes each including a first conductive layer penetrating through one region of an outermost ceramic sheet of the ceramic layer to thereby be embedded therein, and second and third conductive layers sequentially stacked on the first conductive layer; and
   a plurality of internal electrodes and a plurality of via electrodes provided in the plurality of ceramic sheets of the ceramic layer,
   wherein each of the first and second conductive layers is formed of a mixture of a ceramic powder and a metal powder, and some of the plurality of via electrodes contact the first conductive layer which has an embedded portion wider than the contacting via electrode,
   wherein a concentration of the ceramic powder increases from the third conductive layer to the first conductive layer.

2. The multilayer ceramic substrate of claim 1, wherein a concentration of the ceramic powder in the first conductive layer is higher than that in the second conductive layer.

3. The multilayer ceramic substrate of claim 1, wherein a compositional ratio of the ceramic powder and the metal powder in the first conductive layer is (20 to 30) wt % to (70 to 80) wt %.

4. The multilayer ceramic substrate of claim 1, wherein a compositional ratio of the ceramic powder and the metal powder in the second conductive layer is (5 to 10) wt % to (90 to 95) wt %.

5. The multilayer ceramic substrate of claim 1, wherein the third conductive layer is formed of the metal powder.

6. The multilayer ceramic substrate of claim 1, wherein the second conductive layer protrudes from an external surface of the ceramic layer.

7. The multilayer ceramic substrate of claim 1, wherein W1 and W2 satisfy W1≤W2, in which W1 is a width of the first conductive layer and W2 is a width of the second conductive layer.

8. The multilayer ceramic substrate of claim 1, wherein the ceramic layer and the external electrode are co-fired.

9. The multilayer ceramic substrate of claim 1, wherein the ceramic powder of the first and second conductive layers is the same as that of the ceramic layer.

10. The multilayer ceramic substrate of claim 9, wherein the ceramic powder of the first and second conductive layers further contains at least one selected from magnesium carbonate ($MgCO_3$), barium carbonate ($BaCO_3$), calcium carbonate ($CaCO_3$), and silica ($SiO_2$).

11. The multilayer ceramic substrate of claim 1, wherein the third conductive layer covers an upper surface and side surfaces of the second conductive layer.

12. The multilayer ceramic substrate of claim 1, wherein the outermost ceramic sheet of the ceramic layer is at least one of uppermost or lowermost ceramic sheet thereof.

* * * * *